United States Patent
Xing et al.

(10) Patent No.: US 10,056,463 B2
(45) Date of Patent: Aug. 21, 2018

(54) TRANSISTOR AND MANUFACTURING METHOD THEREOF

(71) Applicant: UNITED MICROELECTRONICS CORP., Hsin-Chu (TW)

(72) Inventors: Su Xing, Singapore (SG); Hsueh-Wen Wang, Hsinchu (TW); Chien-Yu Ko, Tainan (TW); Yu-Cheng Tung, Kaohsiung (TW); Jen-Yu Wang, Tainan (TW); Cheng-Tung Huang, Kaohsiung (TW); Yu-Ming Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/628,592

(22) Filed: Jun. 20, 2017

(65) Prior Publication Data

US 2018/0006129 A1    Jan. 4, 2018

Related U.S. Application Data

(63) Continuation-in-part of application No. 15/253,896, filed on Sep. 1, 2016, now Pat. No. 9,722,093.

(30) Foreign Application Priority Data

Jun. 30, 2016    (TW) .............................. 105120712 A

(51) Int. Cl.
*H01L 21/28*    (2006.01)
*H01L 29/51*    (2006.01)
(Continued)

(52) U.S. Cl.
CPC ...... *H01L 29/516* (2013.01); *H01L 21/28291* (2013.01); *H01L 27/11585* (2013.01);
(Continued)

(58) Field of Classification Search
CPC ....... H01L 21/70; H01L 21/702; H01L 21/71; H01L 21/8232; H01L 29/66007
See application file for complete search history.

(56) References Cited

U.S. PATENT DOCUMENTS

| 2006/0038242 A1 | 2/2006 | Hsu |
| 2009/0224287 A1* | 9/2009 | Shin ................ H01L 21/823807 257/192 |

(Continued)

OTHER PUBLICATIONS

Li, Sub-60mV-Swing Negative-Capacitance FinFET without Hysteresis, 2015 IEEE International Electron Devices Meeting (IEDM), pp. 22.6.1-22.6.4, Dec. 7, 2015.
(Continued)

*Primary Examiner* — Cheung Lee
(74) *Attorney, Agent, or Firm* — Winston Hsu

(57) ABSTRACT

A transistor includes a semiconductor channel layer, a gate structure, a gate insulation layer, an internal electrode, and a ferroelectric material layer. The gate structure is disposed on the semiconductor channel layer. The gate insulation layer is disposed between the gate structure and the semiconductor channel layer. The internal electrode is disposed between the gate insulation layer and the gate structure. The ferroelectric material layer is disposed between the internal electrode and the gate structure. A spacer is disposed on the semiconductor channel layer, and a trench surrounded by the spacer is formed above the semiconductor channel layer. The ferroelectric material layer is disposed in the trench, and the gate structure is at least partially disposed outside the trench. The ferroelectric material layer in the transistor of the present invention is used to enhance the electrical characteristics of the transistor.

18 Claims, 9 Drawing Sheets

(51) Int. Cl.
*H01L 29/786* (2006.01)
*H01L 29/66* (2006.01)
*H01L 27/11585* (2017.01)

(52) U.S. Cl.
CPC .... *H01L 29/6684* (2013.01); *H01L 29/66545* (2013.01); *H01L 29/7869* (2013.01)

(56) References Cited

U.S. PATENT DOCUMENTS

2014/0034954 A1 2/2014 Yamazaki
2015/0014813 A1 1/2015 Mueller
2015/0357429 A1 12/2015 Dubourdieu

OTHER PUBLICATIONS

Lee, Ferroelectricity of HfZrO2 in Energy Landscape With Surface Potential Gain for Low-Power Steep-Slope Transistors, IEEE Journal of the Electron Devices Society (vol. 3, Issue: 4) pp. 377-381, Jul. 2015.
Khan, Ferroelectric Negative Capacitance MOSFET: Capacitance Tuning & Antiferroelectric Operation, Electron Devices Meeting (IEDM), 2011 IEEE International, pp. 11.3.1-11.3.4, Dec. 5, 2011.
Chen, Title of Invention: Semiconductor Device, U.S. Appl. No. 15/206,319, filed Jul. 11, 2016.

\* cited by examiner

TRANSISTOR AND MANUFACTURING METHOD THEREOF

CROSS REFERENCE TO RELATED APPLICATIONS

This application is a continuation in part of U.S. application Ser. No. 15/253,896 filed on Sep. 1, 2016, and the entire content of which is hereby incorporated by reference.

BACKGROUND OF THE INVENTION

1. Field of the Invention

The present invention relates to a transistor and a manufacturing method thereof, and more particularly, to a transistor including a ferroelectric material layer and a method of forming the same.

2. Description of the Prior Art

Oxide semiconductor materials, such as indium gallium zinc oxide (IGZO), have been applied in thin film transistors (TFTs) of display devices and field effect transistors (FETs) used in integrated circuits because of properties such as high mobility and low leakage current. However, although the leakage current of the transistor including the oxide semiconductor layer is relatively low, the application field of the present oxide semiconductor transistor is still limited because the threshold voltage (Vt) of the oxide semiconductor transistor is still too high and the on-current (Ion) of the oxide semiconductor transistor is not high enough for some application such as low power devices. For example, the gate insulation layer in the oxide semiconductor transistor has to be thick enough (thicker than 100 angstroms for example) for keeping low leakage current, and the on-current is limited by the thicker gate insulation layer. The gate voltage (Vg) and the drain voltage (Vd) are also too high because of the relatively higher threshold voltage of the oxide semiconductor transistor, and the oxide semiconductor transistor cannot be applied in the low power devices accordingly. Therefore, it is an important subject for the related industries to improve the electrical performances of the oxide semiconductor transistor without deteriorating the original property of low leakage current.

SUMMARY OF THE INVENTION

A transistor and a manufacturing method thereof are provided by the present invention. A ferroelectric material layer is disposed between a gate structure and an internal electrode for forming a negative capacitance effect. The on-current of the transistor may be enhanced, and the transistor may be applied in low power operation accordingly.

According to one embodiment of the present invention, a transistor is provided. The transistor includes a semiconductor channel layer, a gate structure, agate insulation layer, an internal electrode, and a ferroelectric material layer. The gate structure is disposed on the semiconductor channel layer. The gate insulation layer is disposed between the gate structure and the semiconductor channel layer. The internal electrode is disposed between the gate insulation layer and the gate structure. The ferroelectric material layer is disposed between the internal electrode and the gate structure. A spacer is disposed on the semiconductor channel layer, and a trench surrounded by the spacer is formed above the semiconductor channel layer. The ferroelectric material layer is disposed in the trench, and the gate structure is at least partially disposed outside the trench According to one embodiment of the present invention, a manufacturing method of a transistor is provided. The manufacturing method includes the following steps. Agate insulation layer is formed on a semiconductor channel layer. An internal electrode is formed on the gate insulation layer. A ferroelectric material layer is formed on the internal electrode. A gate structure is formed on the ferroelectric material layer. At least a part of the ferroelectric material layer is disposed between the gate structure and the internal electrode. A spacer is formed on the semiconductor channel layer before the step of forming the ferroelectric material layer, and a trench surrounded by the spacer is formed above the semiconductor channel layer. The gate structure is at least partially formed outside the trench.

In the transistor of the present invention, the ferroelectric material layer and the internal electrode disposed between the gate structure and the gate insulation layer may be used to form a negative capacitance effect, and the negative capacitance effect may be used to amplify the gate voltage. The purposes of increasing the on-current and lowering the sub-threshold swing (SS) may be achieved accordingly. In addition, the gate insulation layer may become thinner without influencing the low leakage current performance because of the ferroelectric material layer, the transistor may be used in low power operations, and the application field of the transistor may be expanded accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-5 are schematic drawings illustrating a manufacturing method of the transistor according to the second embodiment of the present invention, wherein FIG. 4 is a schematic drawing in a step subsequent to FIG. 3, and FIG. 5 is a schematic drawing in a step subsequent to FIG. 4.

DETAILED DESCRIPTION

Figure 1:
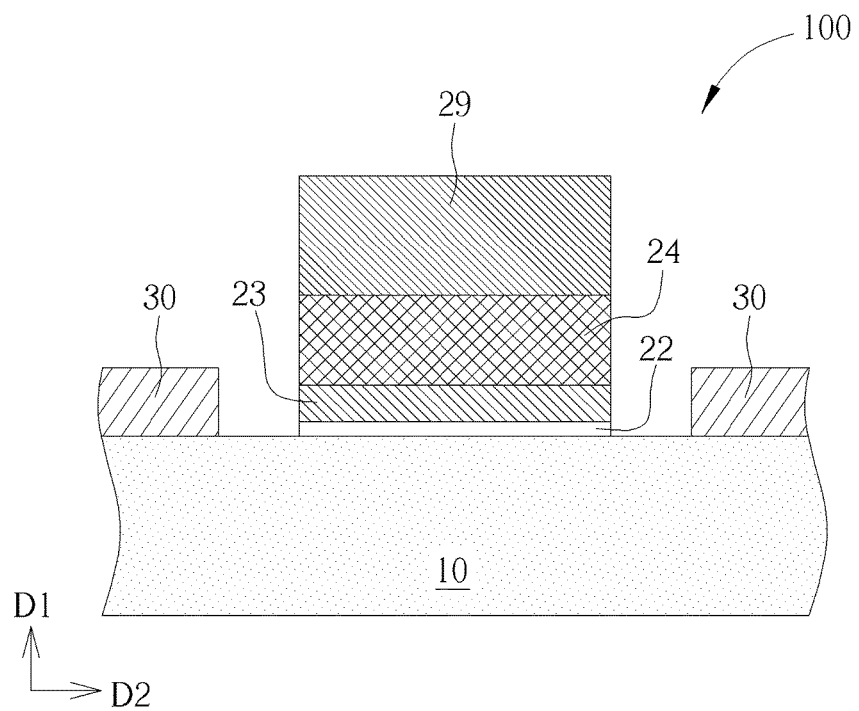
FIG. 1 is a schematic drawing illustrating a transistor according to a first embodiment of the present invention.

Please refer to FIG. 1. FIG. 1 is a schematic drawing illustrating a transistor according to a first embodiment of the present invention. As shown in FIG. 1, a transistor 100 is provided in this embodiment. The transistor 100 includes a semiconductor channel layer 10, a gate structure 29, a gate insulation layer 22, an internal electrode 23, and a ferroelectric material layer 24. The gate structure 29 is disposed on the semiconductor channel layer 10. The gate insulation layer 22 is disposed between the gate structure 29 and the semiconductor channel layer 10. The internal electrode 23 is disposed between the gate insulation layer 22 and the gate structure 29. The ferroelectric material layer 24 is disposed between the internal electrode 23 and the gate structure 29. In other words, the gate insulation layer 22, the internal electrode 23, the ferroelectric material layer 24, and the gate structure 29 are stacked sequentially on the semiconductor channel layer 10 in a vertical direction D1. Because of the material properties of the ferroelectric material layer 24, a negative capacitance effect may be formed by the ferroelectric material layer 24 disposed between the gate structure 29 and the internal electrode 23. The negative capacitance effect may be used to amplify the gate voltage applied to the gate structure 29, and the on-current (Ion) of the transistor 100 may be enhanced accordingly. Additionally, the negative capacitance effect may also be used to decrease the sub-threshold swing (SS), and the transistor 100 may be applied in low power operation devices accordingly. For example, in a condition without the ferroelectric material layer 24, the threshold voltage (Vt) of the transistor is relatively high (about 1.5 volts for example), and the gate voltage and the drain voltage in operations are also relatively high (about 3.3 volts and 1.2 volts respectively, for example). However, in the condition with the ferroelectric material layer 24 disposed in the transistor 100, the gate voltage and the drain voltage for operating the transistor 100 may be reduced as the threshold voltage becomes smaller. For example, the gate voltage and the drain voltage may be lower than 1.2 volts, but not limited thereto. In addition, an equation (1) and an equation (2) listed below may be used to calculate the sub-threshold swing of the transistor 100.

$$Av = \frac{C_{FE}}{|C_{FE}| - C_{OX}} \quad (1)$$

$$SS = 60\,\text{mV/dec} \frac{1}{AV} \quad (2)$$

In the equation (1) and the equation (2), $C_{FE}$ stands for a capacitance of the ferroelectric material layer 24, $C_{OX}$ stands for a capacitance of the gate insulation layer 22, Av stands for an amplification coefficient, and SS stands for the sub-threshold swing. According to the equation (1) and the equation (2), the capacitance of the ferroelectric material layer 24 has to be larger but the difference between the capacitance of the gate insulation layer 22 and the absolute value of the capacitance of the ferroelectric material layer 24 cannot be too large for avoiding hysteresis effect and resulting in relatively low sub-threshold swing. Additionally, the conventional silicon-based negative capacitance field effect transistor (NCFET) is operated under depletion mode, and the depletion capacitance will influence the amplification coefficient of the negative capacitance and the sub-threshold swing of the transistor. However, the transistor in the present invention may be operated under accumulation mode, and the sub-threshold swing may be smaller than that of the silicon-based negative capacitance field effect transistor accordingly.

In this embodiment, the ferroelectric material layer 24 has to be thick enough for generating the required negative capacitance effect, and a thickness of the ferroelectric material layer 24 is larger than a thickness of the gate insulation layer 22, but not limited thereto. The thickness of the gate insulation layer 22 may be reduced (to be less than 20 angstroms for example) for the requirement of low power operations because of the disposition of the ferroelectric material layer 24, but the total thickness of the ferroelectric material layer 24 and the gate insulation layer 22 has to be kept in a substantial range (larger than 100 angstroms for example) for keeping a relatively low off-current ($I_{off}$) of the transistor 100 (about 1E-24 Amp for example). In addition, the transistor 100 may further include two source/drain electrodes 30 disposed on the semiconductor channel layer 10 at two opposite sides of the gate structure 29 in a horizontal direction D2. In this embodiment, the source/drain electrodes 30 may be disposed coplanar with the gate insulation layer 22, but the present invention is not limited to this. In some embodiments of the present invention, the allocation of the source/drain electrodes 30 may be further modified, and the source/drain electrodes 30 may be formed in the semiconductor channel layer 10 or be formed at another side of the semiconductor channel layer 10 (such as a side under the semiconductor channel layer 10), for example. In addition, the transistor 100 in this embodiment is presented as a planar transistor for demonstration, but the present invention is not limited to this. In other words, other kinds of transistors, such as dual gate transistors, triple gate transistor, or gate all around (GAA) transistors, are within the contemplated scope of the present invention.

A manufacturing method of the transistor 100 in this embodiment may include the following steps. The gate insulation layer 22 is formed on the semiconductor channel layer 10. The internal electrode 23 is formed on the gate insulation layer 22. The ferroelectric material layer 24 is formed on the internal electrode 23. The gate structure 29 is formed on the ferroelectric material layer 24. At least a part of the ferroelectric material layer 24 is disposed between the gate structure 29 and the internal electrode 23.

In this embodiment, the semiconductor channel layer 10 may be disposed on a substrate (not shown), and the substrate may include a semiconductor substrate or a non-semiconductor substrate. The semiconductor substrate mentioned above may include a silicon substrate, a silicon germanium substrate, or a silicon-on-insulator (SOI) substrate for example, and the non-semiconductor substrate mentioned above may include a glass substrate, a plastic substrate, or a ceramic substrate for example, but not limited thereto. The materials of the semiconductor channel layer 10 may include oxide semiconductor materials, organic semiconductor materials, inorganic semiconductor materials (such as Si and SiGe), or other suitable semiconductor materials. The oxide semiconductor materials mentioned above may include II-VI compounds (such as zinc oxide, ZnO), II-VI compounds doped with alkaline-earth metals (such as zinc magnesium oxide, ZnMgO), II-VI compounds doped with IIIA compounds (such as indium gallium zinc oxide, IGZO), II-VI compounds doped with VA compounds (such as stannum stibium oxide, SnSbO2), II-VI compounds doped with VIA compounds (such as zinc selenium oxide, ZnSeO), II-VI compounds doped with transition metals (such as zinc zirconium oxide, ZnZrO), or other oxide semiconductor materials composed of mixtures of the above-mentioned materials, but not limited thereto. Additionally, the semiconductor channel layer 10 may be a single layer or a multiple layer structure formed by the above-mentioned semiconductor materials, and the crystalline condition of the semiconductor channel layer 10 is also not limited. For example, the semiconductor channel layer 10 may be amorphous IGZO (a-IGZO), crystal IGZO (c-IGZO), or C-axis aligned crystal IGZO (CAAC-IGZO).

The gate insulation layer 22 may include silicon oxide, silicon oxynitride, a high dielectric constant (high-k) material, or other appropriate dielectric materials. The high-k material mentioned above may include hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other appropriate high-k materials. In some embodiments, the gate structure 29 may include a metal gate structure or a non-metal gate structure, such as a poly gate structure. When the gate structure 29 is a metal gate structure, the internal electrode 23 and the gate structure 29 may respectively include conductive metal materials such as tungsten (W), aluminum (Al), copper (Cu), titaniumaluminide (TiAl), titanium (Ti), titanium nitride (TiN), tantalum (Ta), tantalum nitride (TaN), and titanium aluminum oxide (TiAlO), or other appropriate conductive materials. The ferroelectric material layer 24 may include a perovskite oxide material, such as hafnium zirconium oxide ($HfZrO_x$), barium titanate ($BaTiO_3$), lead titanate ($PbTiO_3$), lead zirconate titanate ($PbZr_xTi_{1-x}O3$, PZT), and barium strontium titanate ($Ba_xSr_{1-x}TiO_3$, BST), or other appropriate ferroelectric materials. Additionally, the ferroelectric material layer 24 may be a single layer or a multiple layer structure formed by the above-mentioned ferroelectric materials, and the Curie temperature (Tc) of the ferroelectric materials mentioned above is higher than 125 degrees Celsius preferably for presenting the material characteristics under the general operation environment.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 2:
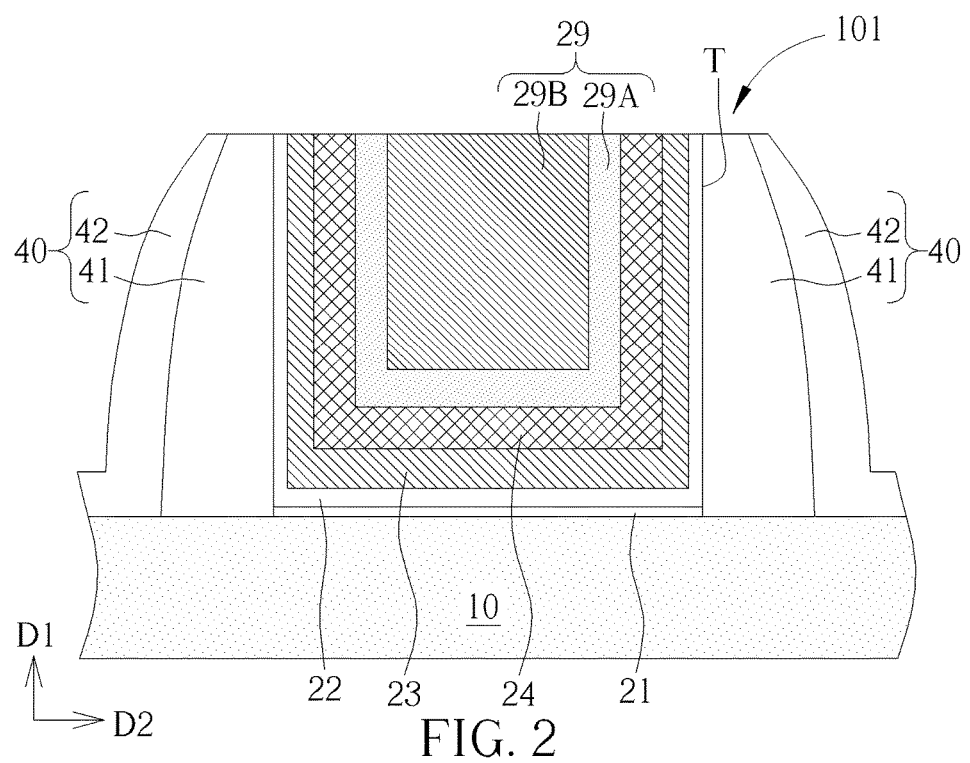
FIG. 2 is a schematic drawing illustrating a transistor according to a second embodiment of the present invention.

Please refer to FIG. 2. FIG. 2 is a schematic drawing illustrating a transistor 101 according to a second embodiment of the present invention. As shown in FIG. 2, the difference this embodiment and the first embodiment mentioned above is that the transistor 101 in this embodiment further includes a spacer 40 disposed on the semiconductor channel layer 10, and a trench T is formed above the semiconductor channel layer 10. The trench T is surrounded by the spacer 40, and the ferroelectric material layer 24 is disposed in the trench T. In this embodiment, the spacer 40 may include a single layer or a multiple layer structure, such as a first spacer 41 and a second spacer 42 overlapping each other. The first spacer 41 and the second spacer 42 may respectively include silicon oxide, silicon nitride, silicon oxynitride, or other appropriate insulation materials. Additionally, in some embodiments, the gate structure 29 may include a work function layer 29A and a low resistance layer 29B. The work function layer 29A may include titanium nitride (TiN), titanium carbide (TiC), tantalum nitride (TaN), tantalum carbide (TaC), tungsten carbide (WC), titanium tri-aluminide ($TiAl_3$), or aluminum titanium nitride (TiAlN), but not limited thereto. The low resistance layer 29B may include tungsten, aluminum, titanium aluminide, titanium, or other low resistance materials. In this embodiment, the gate insulation layer 22, the internal electrode 23, and the gate structure 29 are disposed in the trench T. In a cross-sectional view of the transistor 101, the gate insulation layer 22 may include a U-shaped structure surrounding the ferroelectric material layer 29 in the trench T, the internal electrode 23 may also include a U-shaped structure surrounding the ferroelectric material layer 24 in the trench T, and the ferroelectric material layer may also include a U-shaped structure surrounding the gate structure 29 in the trench T. Additionally, in the gate structure 29 disposed in the trench T, the work function layer 29A may also include a U-shaped structure surrounding the low resistance layer 29B in a cross-sectional view of the transistor 101, but not limited thereto. In addition, the transistor 101 may further include an interface layer 21, such as an oxide layer, formed between the gate insulation layer 22 and the semiconductor channel layer 10, but not limited thereto.

Figure 3:
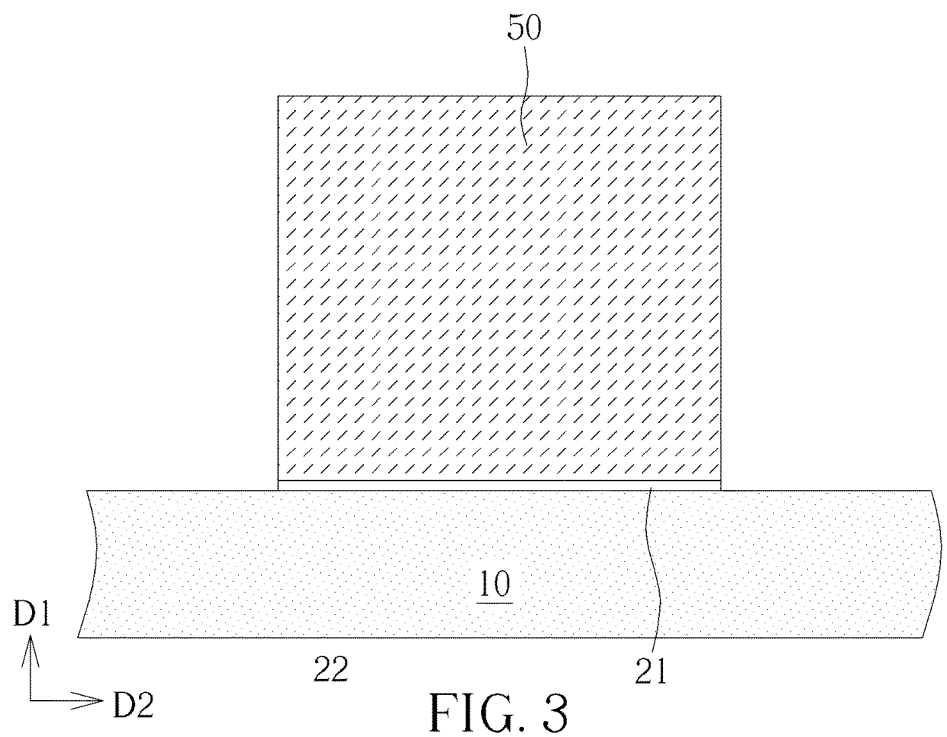
Figure 4:
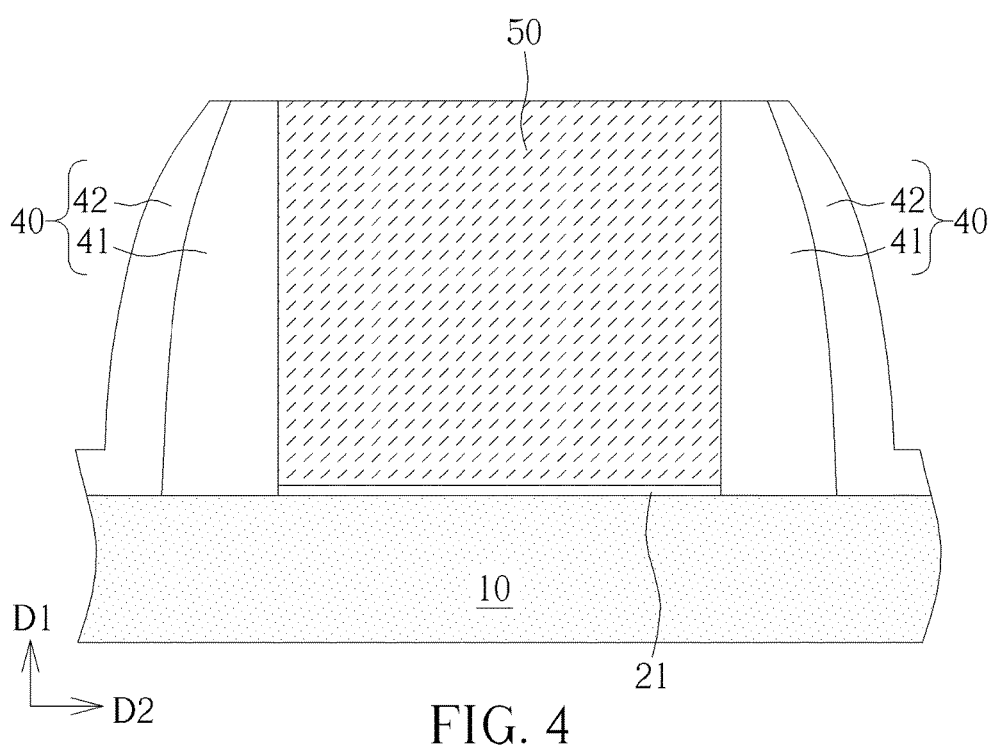
Figure 5:
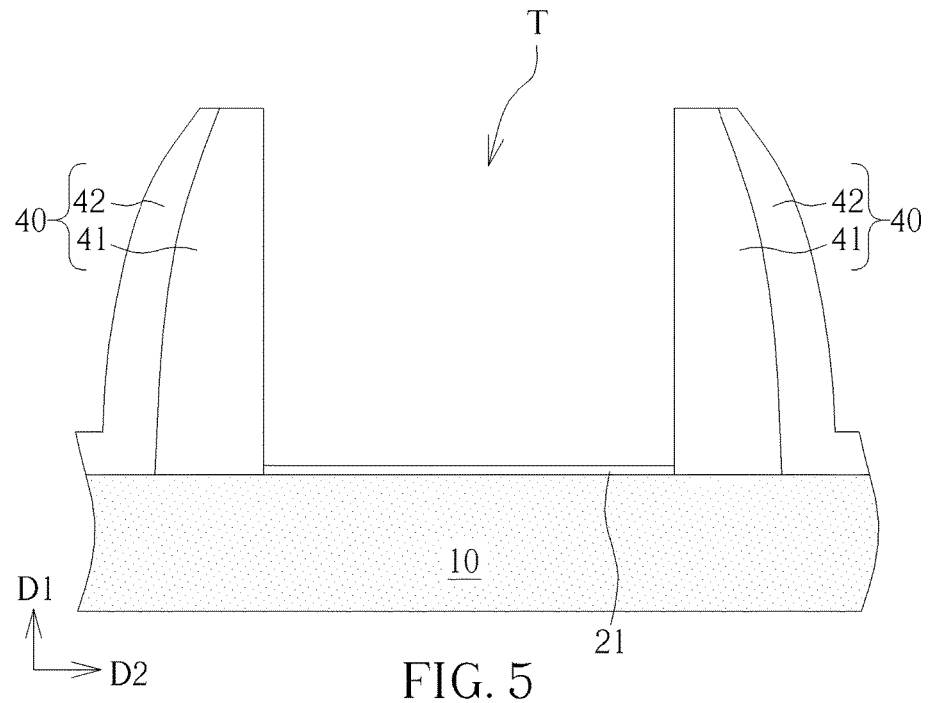

Please refer to FIGS. 2-5. FIGS. 3-5 are schematic drawings illustrating a manufacturing method of the transistor 101 according to the second embodiment of the present invention. The manufacturing method of the transistor 101 in this embodiment may include the following steps. As shown in FIG. 3, the interface layer 21 and a dummy gate 50 are formed on the semiconductor channel layer 10. The dummy gate 50 and the interface layer 21 may be formed by patterning material layers on the semiconductor channel layer 10 simultaneously, such as by etching processes with the same patterned mask, but not limited thereto. As shown in FIG. 4, the spacer 40 is then formed on the semiconductor channel layer 10, and the spacer 40 is formed on sidewalls of the dummy gate 50 and the interface layer 21. In other words, the dummy gate 50 is formed before the step of forming the spacer 40. The first spacer 41 may be formed by a process of forming a conformal material layer on the semiconductor channel layer 10 and the dummy gate 50 and an etching back process. In addition, a planarization process, such as a chemical mechanical polishing (CMP) process, or an etching back process may be used to expose a top surface of the dummy gate 50. Before the planarization process mentioned above, an interlayer dielectric (not shown) may be formed on the spacer 40, and the space between the spacers 40 may be filled with the interlayer dielectric before the planarization process is performed to expose the top surface of the dummy gate 50. As shown in FIG. 4 and FIG. 5, the dummy gate 50 is removed for forming the trench T surrounded by the spacer 40. Subsequently, as shown in FIG. 2, the gate insulation layer 22, the internal electrode 23, the ferroelectric material layer 24, and the gate structure 29 are sequentially formed in the trench T. In other words, the manufacturing method in this embodiment may be regarded as a high-k last replacement metal gate (RMG) process.

Figure 6:
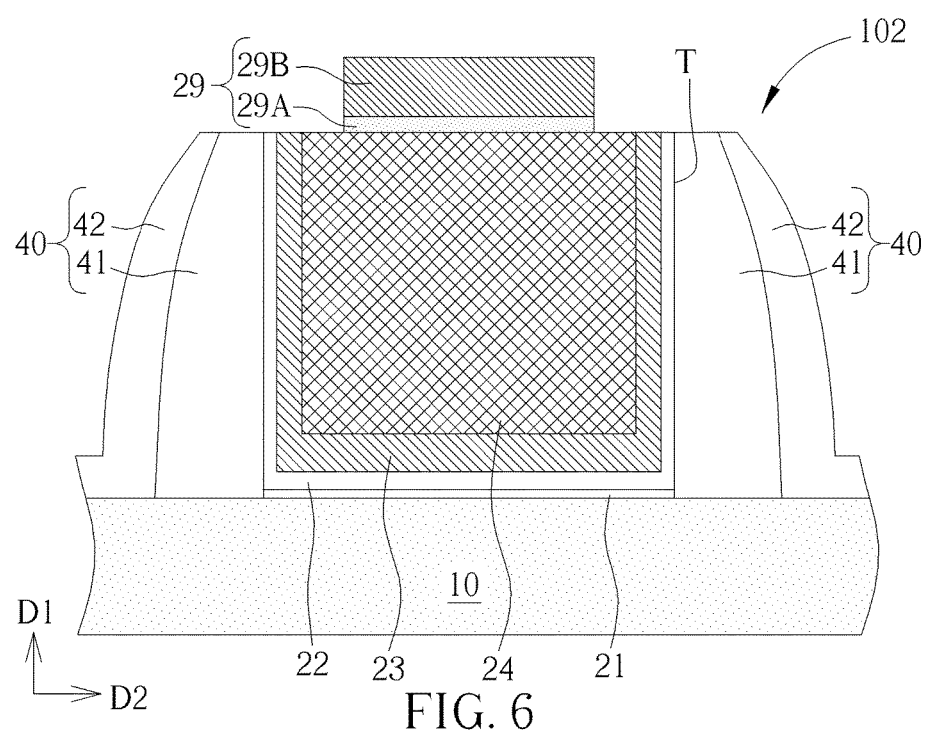
FIG. 6 is a schematic drawing illustrating a transistor according to a third embodiment of the present invention.

Please refer to FIG. 6. FIG. 6 is a schematic drawing illustrating a transistor 102 according to a third embodiment of the present invention. As shown in FIG. 6, the difference between this embodiment and the second embodiment mentioned above is that the gate structure 29 in this embodiment is at least partially disposed outside the trench T. Specifically, the gate structure 29 in this embodiment may be totally disposed outside the trench T. In other words, when the ferroelectric material layer 24 has to be thick enough, a planarization process may be performed to remove the excess ferroelectric material after the step of filling the trench T with the ferroelectric material layer 24, and the gate structure 29 may then be formed on the ferroelectric material layer 24 and at least partially formed outside the trench T. In some embodiments, the gate structure 29 may be totally formed outside the trench T, but the present invention is not limited to this. In some embodiments, the gate structure 29 may be partly formed in the trench T and partly formed outside the trench T.

Figure 7:
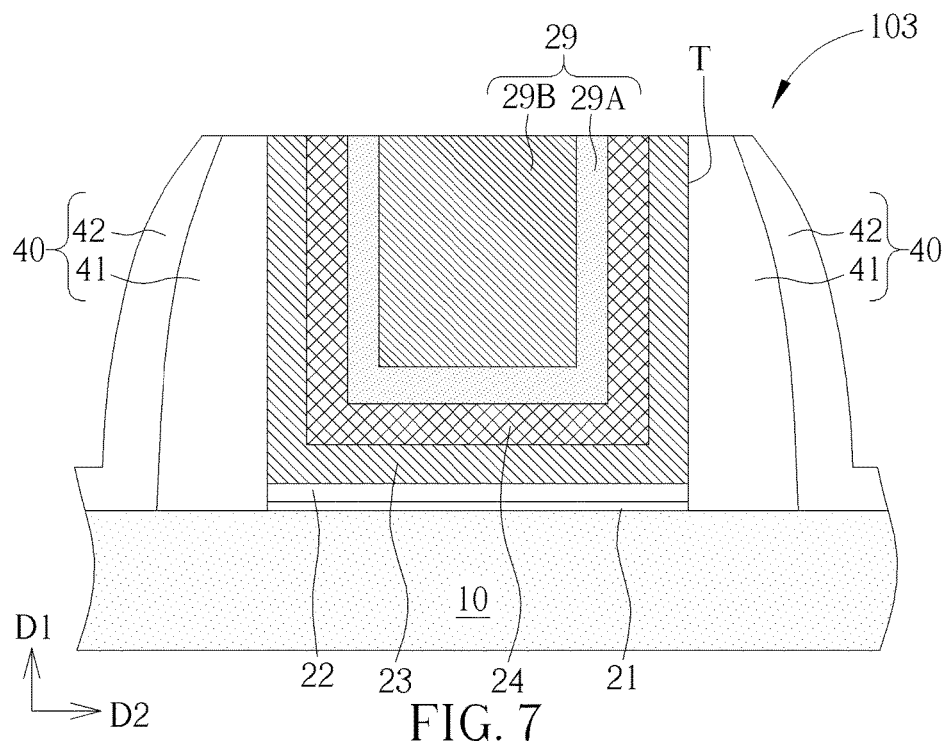
FIG. 7 is a schematic drawing illustrating a transistor according to a fourth embodiment of the present invention.
Figure 8:
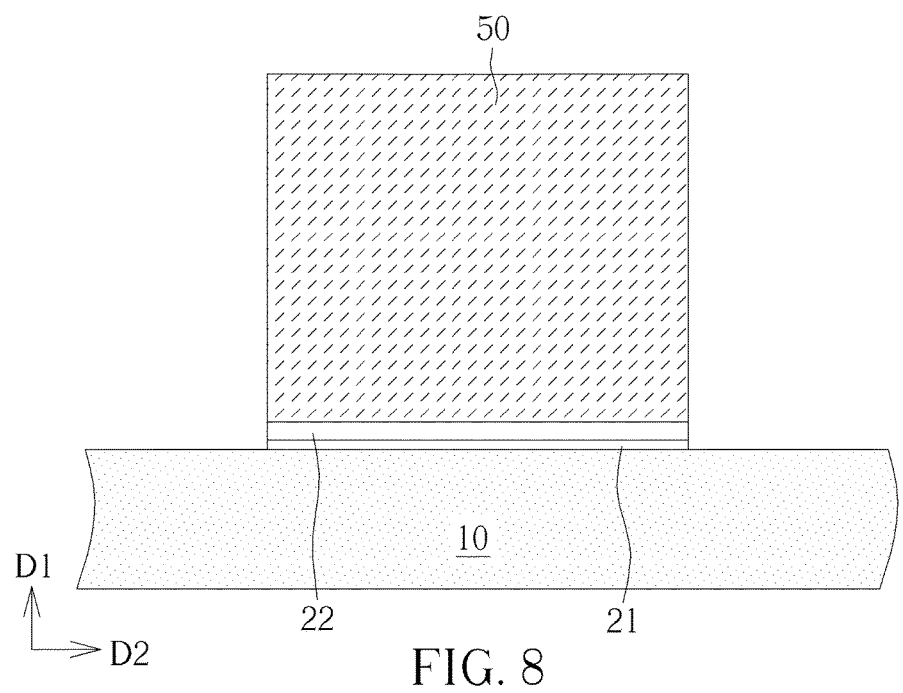
FIG. 8 is a schematic drawing illustrating a manufacturing method of the transistor according to the fourth embodiment of the present invention.
Figure 9:
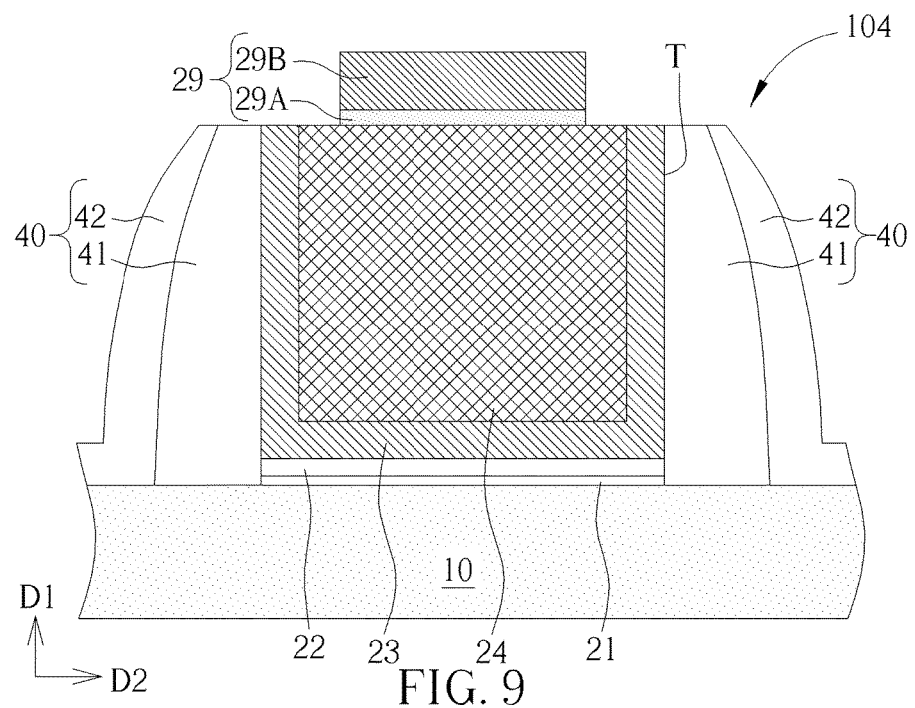
FIG. 9 is a schematic drawing illustrating a transistor according to a fifth embodiment of the present invention.

Please refer to FIG. 7 and FIG. 8. FIG. 7 is a schematic drawing illustrating a transistor 103 according to a fourth embodiment of the present invention, and FIG. 8 is a schematic drawing illustrating a manufacturing method of the transistor 103 in this embodiment. As shown in FIG. 7 and FIG. 8, the difference between this embodiment and the second embodiment mentioned above is that the gate insulation layer 22 and the dummy gate 50 in this embodiment are formed on the semiconductor channel layer 10 first before the steps of forming the spacer 40 and the trench T. Accordingly, all of the gate insulation layer 22 in this embodiment is disposed under the internal electrode 23 in the vertical direction D1 and the gate insulation layer 22 does not include the U-shaped structure. The manufacturing method in this embodiment may be regarded as a high-k first RMG process. As shown in FIG. 9, in a transistor 104 according to a fifth embodiment of the present invention, the gate structure 29 may also be at least partially disposed outside the trench T. Specifically, the gate structure 29 in this embodiment may be totally disposed outside the trench T. In other words, when the ferroelectric material layer 24 has to be thick enough, a planarization process may be performed to remove the excess ferroelectric material after the step of filling the trench T with the ferroelectric material layer 24, and the gate structure 29 may then be formed on the ferroelectric material layer 24.

Figure 10:
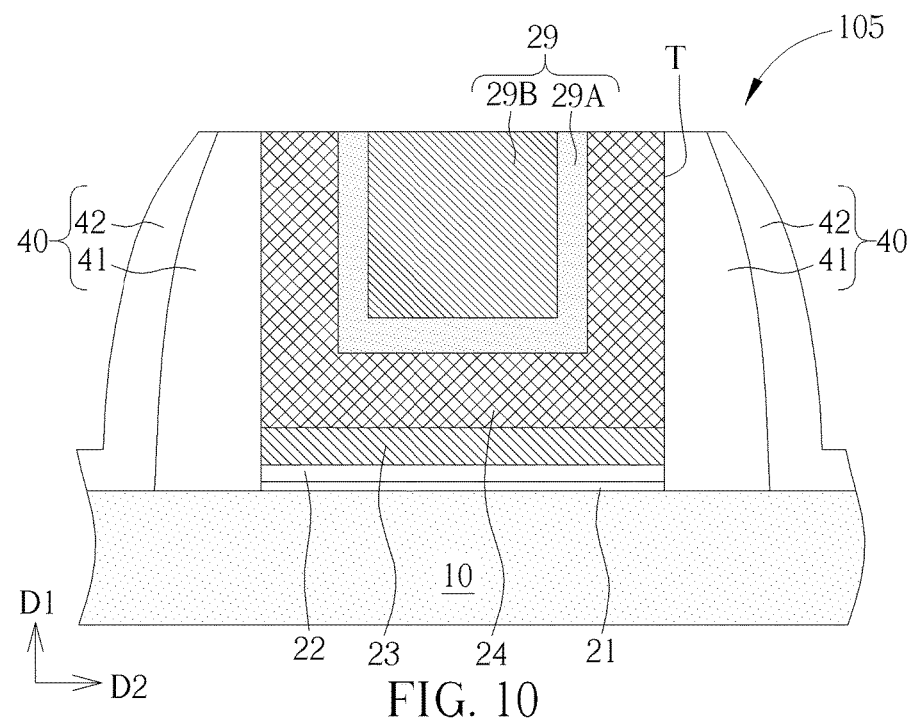
FIG. 10 is a schematic drawing illustrating a transistor according to a sixth embodiment of the present invention.
Figure 11:
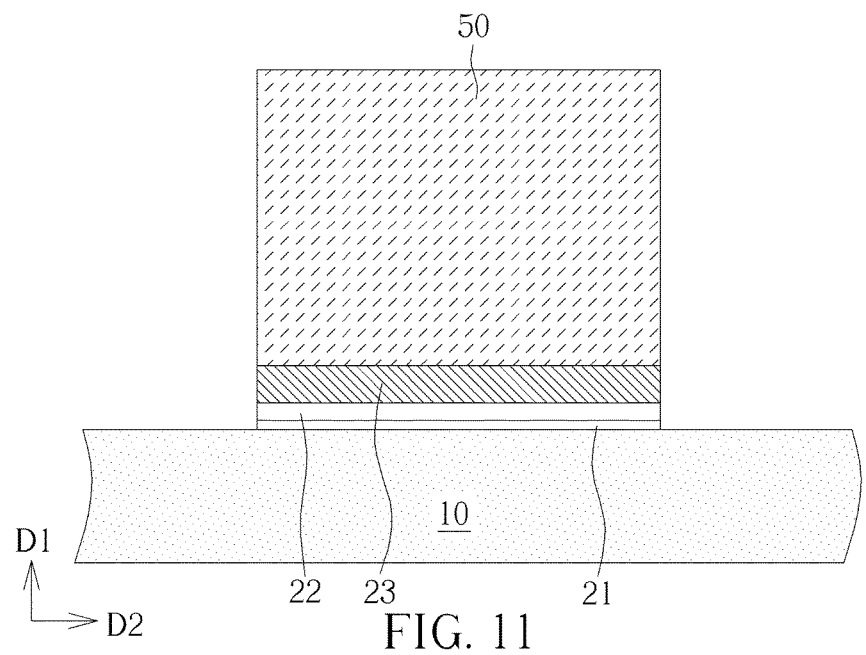
FIG. 11 is a schematic drawing illustrating a manufacturing method of the transistor according to the sixth embodiment of the present invention.
Figure 12:
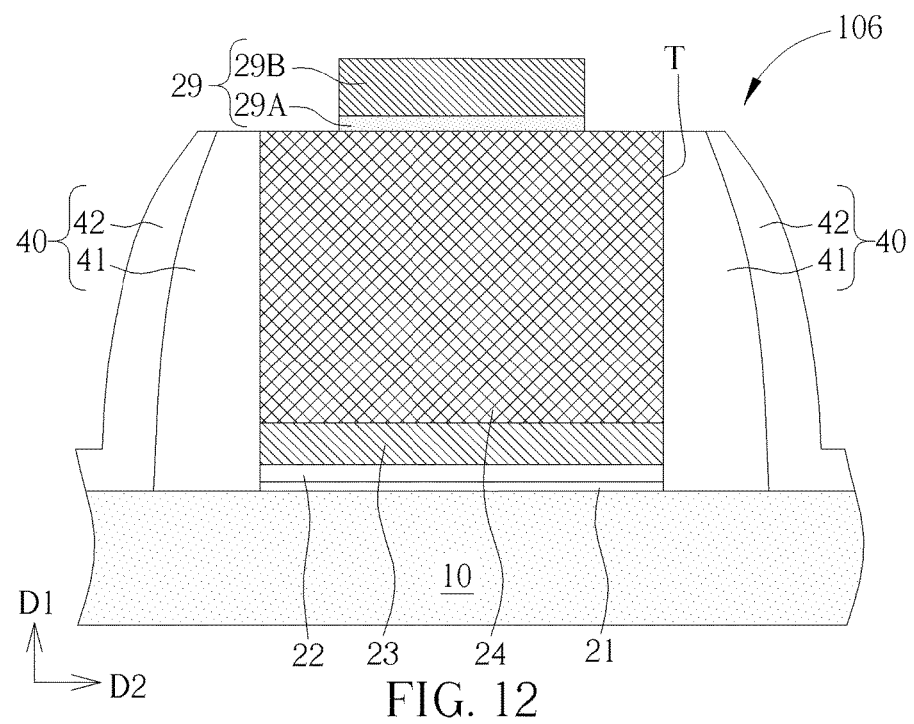
FIG. 12 is a schematic drawing illustrating a transistor according to a seventh embodiment of the present invention.
Figure 13:
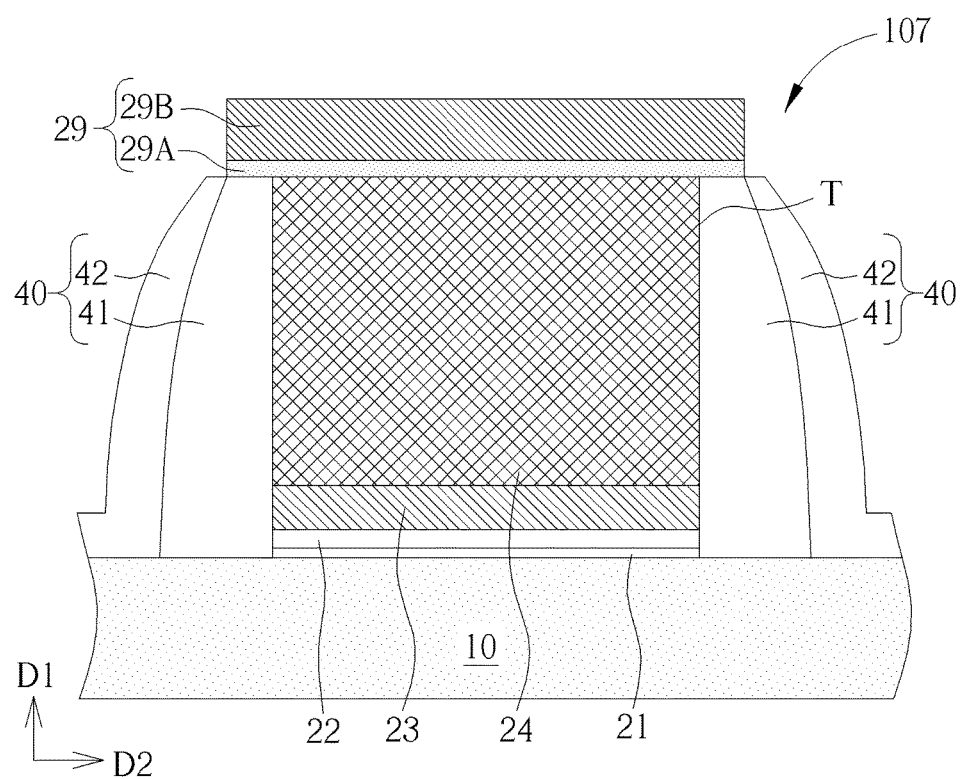
FIG. 13 is a schematic drawing illustrating a transistor according to an eighth embodiment of the present invention.

Please refer to FIG. 10 and FIG. 11. FIG. 10 is a schematic drawing illustrating a transistor 105 according to a sixth embodiment of the present invention, and FIG. 11 is a schematic drawing illustrating a manufacturing method of the transistor 105 in this embodiment. As shown in FIG. 10 and FIG. 11, the difference between this embodiment and the fourth embodiment mentioned above is that the internal electrode 23, the gate insulation layer 22 and the dummy gate 50 in this embodiment are formed on the semiconductor channel layer 10 before the steps of forming the spacer 40 and the trench T. Accordingly, all of the internal electrode 23 in this embodiment is disposed under the ferroelectric material layer 24 in the vertical direction D1 and the internal electrode 23 does not include the U-shaped structure in this embodiment. Additionally, as shown in FIG. 12, in a transistor 106 according to a seventh embodiment of the present invention, the gate structure 29 may also be at least partially disposed outside the trench T. Specifically, the gate structure 29 in the seventh embodiment may be totally disposed outside the trench T. In other words, when the ferroelectric material layer 24 has to be thick enough, a planarization process may be performed to remove the excess ferroelectric material first, and the gate structure 29 may then be formed on the ferroelectric material layer 24. In this condition, the top surface of the ferroelectric material layer 24 and the top surface of the spacer 40 are substantially coplanar, but not limited thereto. As shown in FIG. 13, in a transistor 107 according to an eighth embodiment of the present invention, the gate structure 29 may further cover at least a part of the spacer 40 in the vertical direction D1. For example, the gate structure 29 may cover the first spacer 41 only or cover both the first spacer 41 and the second spacer 42 (not shown in FIG. 13) for ensuring that the capacitance formed by the ferroelectric layer 24 disposed between the gate structure 29 and the internal electrode 23 may meet the requirements.

Figure 14:
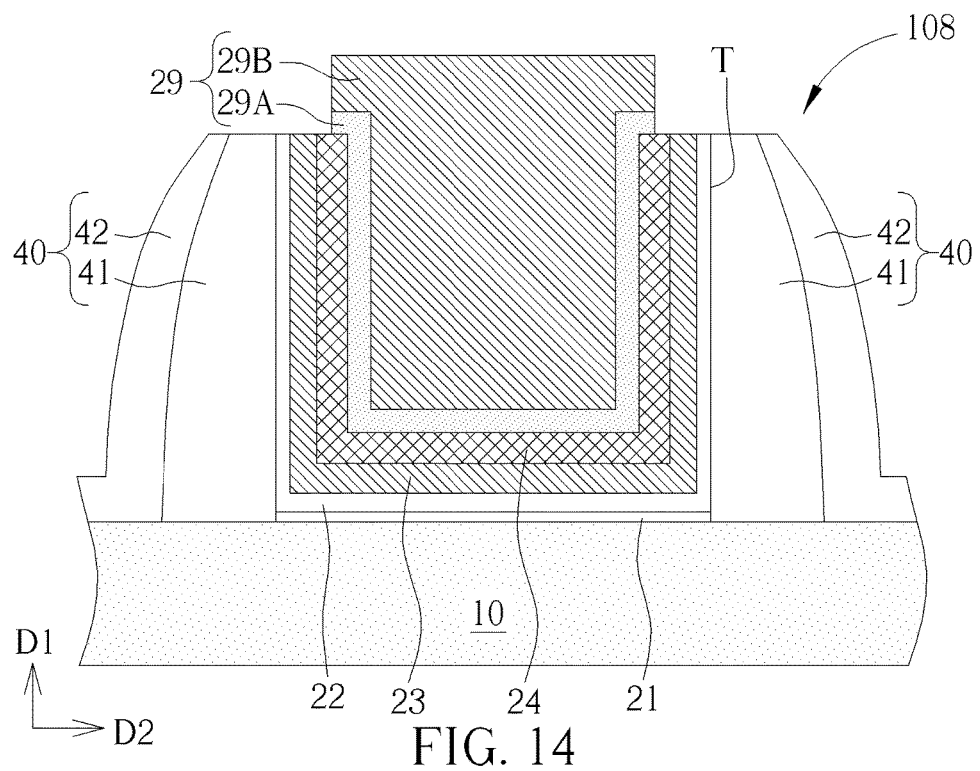
FIG. 14 is a schematic drawing illustrating a transistor according to a ninth embodiment of the present invention.
Figure 15:
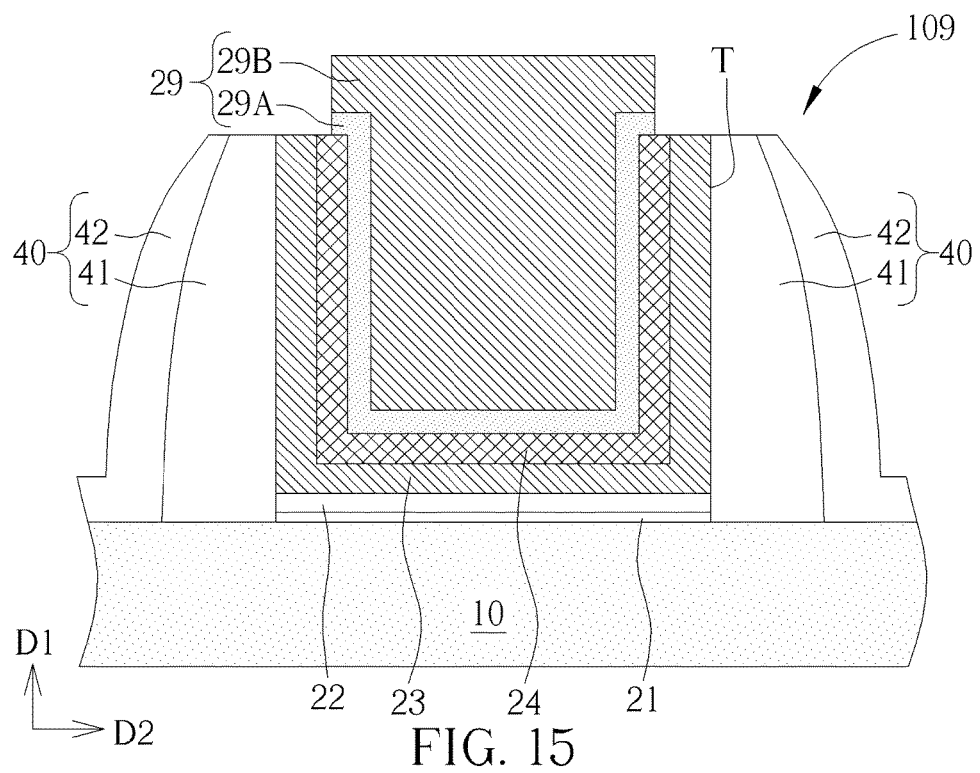
FIG. 15 is a schematic drawing illustrating a transistor according to a tenth embodiment of the present invention.
Figure 16:
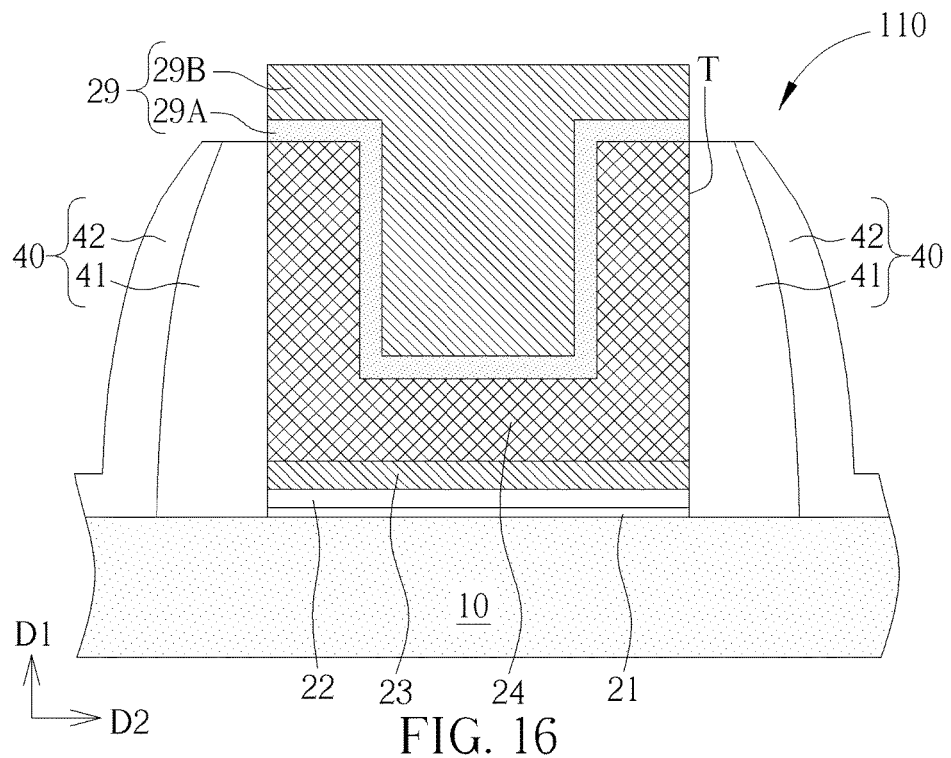
FIG. 16 is a schematic drawing illustrating a transistor according to an eleventh embodiment of the present invention.
Figure 17:
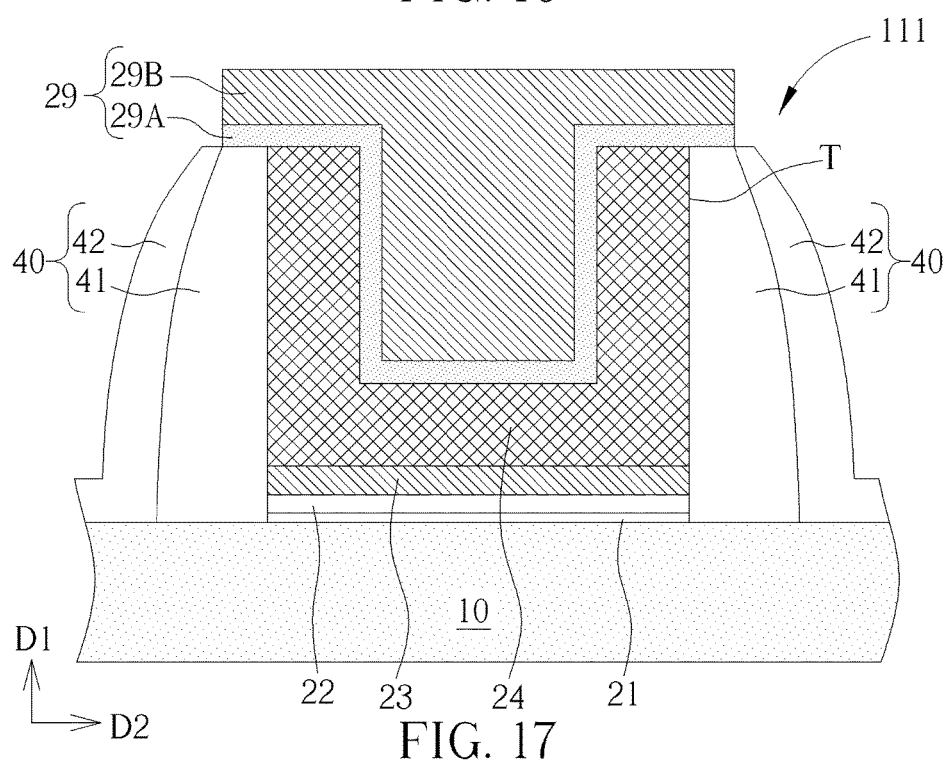
FIG. 17 is a schematic drawing illustrating a transistor according to a twelfth embodiment of the present invention.

Please refer to FIGS. 14-17. FIG. 14 is a schematic drawing illustrating a transistor 108 according to a ninth embodiment of the present invention. FIG. 15 is a schematic drawing illustrating a transistor 109 according to a tenth embodiment of the present invention. FIG. 16 is a schematic drawing illustrating a transistor 110 according to an eleventh embodiment of the present invention. FIG. 17 is a schematic drawing illustrating a transistor 111 according to a twelfth embodiment of the present invention. As shown in FIG. 14, the difference between the transistor 108 and the transistor in the third embodiment mentioned above is that the gate structure 29 in the transistor 108 is partly disposed in the trench T and partly disposed outside the trench T. As shown in FIG. 15, the difference between the transistor 109 and the transistor in the fifth embodiment mentioned above is that the gate structure 29 in the transistor 109 is partly disposed in the trench T and partly disposed outside the trench T. As shown in FIG. 16, the difference between the transistor 110 and the transistor in the seventh embodiment mentioned above is that the gate structure 29 in the transistor 110 is partly disposed in the trench T and partly disposed outside the trench T. As shown in FIG. 17, the difference between the transistor 111 and the transistor in the eighth embodiment mentioned above is that the gate structure 29 in the transistor 111 is partly disposed in the trench T and partly disposed outside the trench T.

To summarize the above descriptions, in the transistor and the manufacturing method thereof in the present invention, the ferroelectric material layer and the internal electrode are disposed between the gate structure and the gate insulation layer, and the negative capacitance effect is formed because of the material characteristics of the ferroelectric material layer. The purposes of amplifying the gate voltage, increasing the on-current, and lowering the sub-threshold swing may be achieved accordingly. In addition, the gate insulation layer may become thinner without influencing the low leakage current performance because of the ferroelectric material layer disposed in the transistor of the present invention, the transistor may therefore be used in low power operations, and the application field of the transistor may be expanded accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A transistor, comprising:
a semiconductor channel layer;
a gate structure disposed on the semiconductor channel layer;
a gate insulation layer disposed between the gate structure and the semiconductor channel layer;
an internal electrode disposed between the gate insulation layer and the gate structure;
a ferroelectric material layer disposed between the internal electrode and the gate structure; and a spacer disposed on the semiconductor channel layer, wherein a trench surrounded by the spacer is formed above the semiconductor channel layer, the ferroelectric material layer is disposed in the trench, and the gate structure is at least partially disposed outside the trench, wherein the gate structure disposed outside the trench overlaps the topmost surface of the ferroelectric material layer, and the ferroelectric material layer comprises a U-shaped structure in the trench.

2. The transistor of claim 1, wherein a thickness of the ferroelectric material layer is larger than a thickness of the gate insulation layer.

3. The transistor of claim 1, wherein the ferroelectric material layer comprises a perovskite oxide material.

4. The transistor of claim 1, wherein the semiconductor channel layer includes indium gallium zinc oxide (IGZO).

5. The transistor of claim 1, wherein the gate insulation layer is disposed in the trench, and the gate insulation layer comprises a U-shaped structure surrounding the ferroelectric material layer in the trench.

6. The transistor of claim 1, wherein the internal electrode is disposed in the trench, and the internal electrode comprises a U-shaped structure surrounding the ferroelectric material layer in the trench.

7. The transistor of claim 1, wherein the gate structure is partly disposed in the trench and partly disposed outside the trench.

8. The transistor of claim 1, wherein the gate structure comprises a metal gate structure.

9. The transistor of claim 1, wherein the gate structure disposed outside the trench overlaps a top surface of the spacer.

10. A manufacturing method of a transistor, comprising:
    forming a gate insulation layer on a semiconductor channel layer;
    forming an internal electrode on the gate insulation layer;
    forming a ferroelectric material layer on the internal electrode;
    forming a gate structure on the ferroelectric material layer, wherein at least a part of the ferroelectric material layer is disposed between the gate structure and the internal electrode; and
    forming a spacer on the semiconductor channel layer before the step of forming the ferroelectric material layer, wherein a trench surrounded by the spacer is formed above the semiconductor channel layer, and the gate structure is at least partially formed outside the trench, wherein the gate structure formed outside the trench overlaps the topmost surface of the ferroelectric material layer, and the ferroelectric material layer comprises a U-shaped structure in the trench.

11. The manufacturing method of the transistor of claim 10, wherein the step of forming the trench comprises:
    forming a dummy gate on the semiconductor channel layer before the step of forming the spacer, wherein the spacer is formed on a side wall of the dummy gate; and
    removing the dummy gate for forming the trench surrounded by the spacer.

12. The manufacturing method of the transistor of claim 10, wherein the ferroelectric material layer is formed after the step of forming the trench, and the ferroelectric material layer is formed in the trench.

13. The manufacturing method of the transistor of claim 12, wherein the internal electrode is formed after the step of forming the trench, and the internal electrode is formed in the trench.

14. The manufacturing method of the transistor of claim 13, wherein the internal electrode comprises a U-shaped structure surrounding the ferroelectric material layer in the trench.

15. The manufacturing method of the transistor of claim 13, wherein the gate insulation layer is formed after the step of forming the trench, and the gate insulation layer is formed in the trench.

16. The manufacturing method of the transistor of claim 15, wherein the gate insulation layer comprises a U-shaped structure surrounding the internal electrode in the trench.

17. The manufacturing method of the transistor of claim 10, wherein the gate structure is partly formed in the trench and partly formed outside the trench.

18. The manufacturing method of the transistor of claim 10, wherein the gate structure comprises a metal gate structure.

* * * * *